(12) United States Patent
Suzuki et al.

(10) Patent No.: US 11,195,700 B2
(45) Date of Patent: Dec. 7, 2021

(54) ETCHING APPARATUS

(71) Applicant: CANON ANELVA CORPORATION, Kawasaki (JP)

(72) Inventors: Hidekazu Suzuki, Machida (JP); Masami Shibagaki, Hachioji (JP); Atsushi Sekiguchi, Fuchu (JP)

(73) Assignee: CANON ANELVA CORPORATION, Kawasaki (JP)

(*) Notice: Subject to any disclaimer, the term of this patent is extended or adjusted under 35 U.S.C. 154(b) by 785 days.

(21) Appl. No.: 14/277,295

(22) Filed: May 14, 2014

(65) Prior Publication Data

US 2014/0338836 A1 Nov. 20, 2014

(30) Foreign Application Priority Data

May 17, 2013 (JP) .............................. JP2013-104983
Apr. 9, 2014 (JP) .............................. JP2014-080474

(51) Int. Cl.
*H01J 37/32* (2006.01)

(52) U.S. Cl.
CPC .. *H01J 37/32385* (2013.01); *H01J 37/32541* (2013.01); *H01J 37/32568* (2013.01);
(Continued)

(58) Field of Classification Search
CPC .............. C23C 16/458; C23C 16/4581; C23C 16/4582; C23C 16/4583; C23C 16/4585; C23C 16/505; C23C 16/509; H01J 37/32091; H01J 37/32348; H01J 37/32385; H01J 37/32403; H01J 37/32532;
(Continued)

(56) References Cited

U.S. PATENT DOCUMENTS 4,342,901 A * 8/1982 Zajac ................ H01J 37/32623
204/192.32
4,461,237 A * 7/1984 Hinkel ................ C23C 16/5096
118/50.1
(Continued)

FOREIGN PATENT DOCUMENTS

JP S59-175727 A 10/1984
JP H08-88190 A 4/1996
(Continued)

OTHER PUBLICATIONS

Office Action dated Mar. 22, 2016, by the Taiwanese Patent Office in corresponding Taiwanese Patent Application No. 103117007, and an English Translation of the Office Action. (6 pages).
(Continued)

*Primary Examiner* — Benjamin Kendall
(74) *Attorney, Agent, or Firm* — Buchanan Ingersoll & Rooney PC

(57) ABSTRACT

An etching apparatus includes a chamber capable of being evacuated, a first electrode provided in the chamber and including a tray support portion configured to support a tray which can hold a plurality of substrates and load/unload the substrates into/from the chamber, and a voltage applying unit configured to apply a voltage to the first electrode. A dielectric plate is attached to a portion, of an obverse surface of the first electrode, which faces an outer edge portion of a non-target surface of the substrate.

23 Claims, 14 Drawing Sheets

(52) U.S. Cl.
CPC .. *H01J 37/32577* (2013.01); *H01J 37/32715* (2013.01); *H01J 2237/334* (2013.01); *H01J 2237/3341* (2013.01)

(58) Field of Classification Search
CPC .......... H01J 37/32541; H01J 37/32568; H01J 37/32577; H01J 37/32715; H01J 37/32807; H01J 2237/334; H01J 2237/3341; H05H 1/2406; H05H 2001/2412
See application file for complete search history.

(56) References Cited

U.S. PATENT DOCUMENTS

| | | | |
|---|---|---|---|
| 4,843,683 | A | 7/1989 | Grammer |
| 5,690,781 | A | 11/1997 | Yoshida et al. |
| 6,165,907 | A | 12/2000 | Yoneda et al. |
| 6,585,851 | B1 | 7/2003 | Ohmi et al. |
| 7,736,528 | B2 | 6/2010 | Okita et al. |
| 7,922,862 | B2 * | 4/2011 | Okumura .......... H01J 37/32009 118/723 E |
| 8,231,798 | B2 | 7/2012 | Okita et al. |
| 8,591,754 | B2 | 11/2013 | Okita et al. |
| 2004/0238488 | A1 | 12/2004 | Choi et al. |
| 2005/0241583 | A1* | 11/2005 | Buechel ............ C23C 16/45565 118/723 E |
| 2008/0149590 | A1 | 6/2008 | Maeda et al. |
| 2009/0101284 | A1* | 4/2009 | Higuma ............ H01J 37/32532 156/345.51 |
| 2009/0126634 | A1* | 5/2009 | Yamazawa .......... C23C 16/5096 118/723 R |
| 2010/0282709 | A1* | 11/2010 | Kang ...................... H01J 37/20 216/13 |
| 2011/0192540 | A1 | 8/2011 | Higuma et al. |
| 2012/0168083 | A1 | 7/2012 | Yamazawa |
| 2012/0267049 | A1* | 10/2012 | Stevens ............... C23C 16/5096 156/345.34 |
| 2013/0048217 | A1* | 2/2013 | Shiraiwa ........... H01J 37/32715 156/345.53 |
| 2013/0193132 | A1* | 8/2013 | Serebryanov ..... H01L 21/67115 219/385 |
| 2014/0048527 | A1 | 2/2014 | Okita et al. |

FOREIGN PATENT DOCUMENTS

| | | |
|---|---|---|
| JP | 10-20473 A | 1/1998 |
| JP | H10-050665 A | 2/1998 |
| JP | 2002-246368 A | 8/2002 |
| JP | 2002-540616 A | 11/2002 |
| JP | 2005-136165 A | 5/2005 |
| JP | 2007-109770 A | 4/2007 |
| JP | 2008-159097 A | 7/2008 |
| JP | 2008-243973 A | 10/2008 |
| JP | 2010-225775 A | 10/2010 |
| JP | 2011-155170 A | 8/2011 |
| JP | 2012-234904 A | 11/2012 |
| KR | 10-2013-0042695 A | 4/2013 |
| TW | 418461 B | 1/2001 |
| TW | I281713 B | 5/2007 |
| TW | I396484 B | 5/2013 |
| WO | 00-58994 A1 | 10/2000 |

OTHER PUBLICATIONS

Office Action (Notification of the First Office Action) dated Jul. 25, 2016, by the State Intellectual Property Office of the People's Republic of China in the corresponding Chinese Patent Application 201410207252.1 and English Translation of the Office Action. (18 pages).

Notice of Allowance issued in corresponding Chinese Patent Application No. 201410207252.1, dated Mar. 7, 2018. (4 pages).

Office Action dated Dec. 22, 2017, by the Japanese Patent Office in corresponding Japanese Patent Application No. 2014-080474. (2 pages).

\* cited by examiner

PRIOR ART

FIG. 22A
PRIOR ART
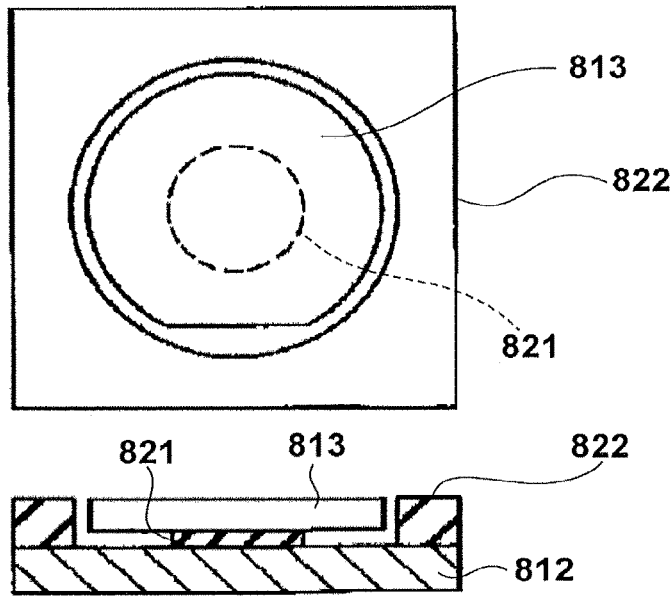
FIG. 22B
PRIOR ART
FIG. 23
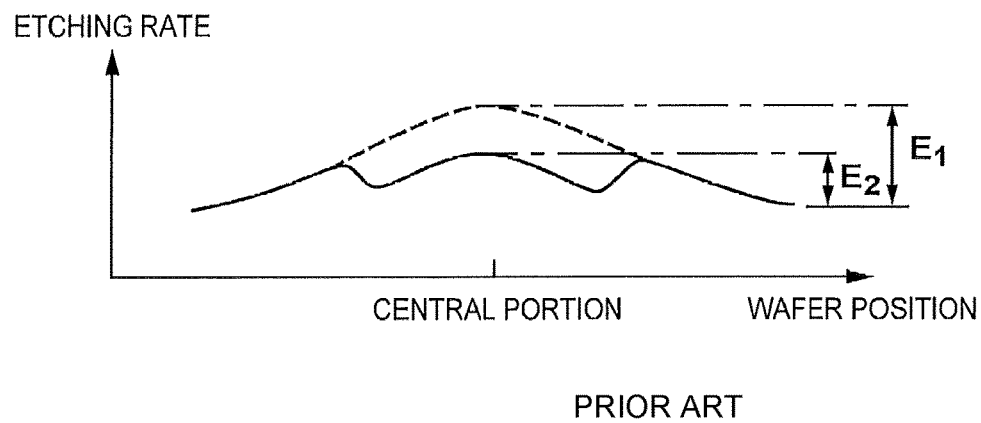
PRIOR ART

PRIOR ART

ETCHING APPARATUS

BACKGROUND OF THE INVENTION

Field of the Invention

The present invention relates to an etching apparatus which etches a substrate while applying a voltage to an electrode.

Description of the Related Art

FIG. 21 is a view showing a schematic arrangement of the dry etching apparatus disclosed in Japanese Patent Laid-Open No. 10-20473. FIG. 22A is a plan view of the lower electrode structure of the dry etching apparatus. FIG. 22B is a sectional view of FIG. 22A. FIG. 23 shows an etching rate distribution within a wafer plane in the first embodiment disclosed in Japanese Patent Laid-Open No. 10-20473 in comparison with a conventional apparatus. Electrodes 811 and 812 are arranged in an etching chamber 810 so as to face each other. The upper electrode 811 is grounded. The lower electrode 812 on which a semiconductor wafer 813 as a target substrate is mounted is connected to a high-frequency power supply 815 via a matching circuit 814.

A conventional etching apparatus exhibits a large etching rate difference E1 which is the difference between a central portion having a maximum value and a peripheral portion having a minimum value as indicated by the broken line in FIG. 23. For this reason, in the etching apparatus disclosed in Japanese Patent Laid-Open No. 10-20473, as shown in FIGS. 22A and 22B, a disk-like quartz plate 821 functioning as a high-frequency attenuation member is placed on an upper central surface portion of the electrode 812, the semiconductor wafer 813 is mounted on the quartz plate 821, and a quartz plate 822 having an opening is placed on a peripheral portion of the electrode 812 so as to be almost flush with the obverse surface of the semiconductor wafer 813. This decreases the etching rate at a central portion, as indicated by the solid line in FIG. 23, thereby setting the etching rate difference to E2 (E2<E1).

FIG. 24 is a schematic sectional view of the dry etching apparatus disclosed in Japanese Patent Laid-Open No. 2007-109770. A tray 915 accommodates a plurality of substrates 902. The dry etching apparatus in Japanese Patent Laid-Open No. 2007-109770 aims to improve cooling efficiency for a substrate by holding the substrate on a substrate susceptor with a high degree of contact and make processes uniform throughout the entire region of the obverse surface of the substrate including a portion near the outer peripheral edge.

The tray 915 of a dry etching apparatus 901 shown in FIG. 24 includes substrate accommodation holes 919A to 919D extending through the tray in the thickness direction and substrate support portions 921 which support outer peripheral edge portions of the lower surfaces of the substrates 902. A dielectric plate 923 includes a tray support surface which supports the lower surface of the tray 915 and substrate mounting portions 929A to 929D which are inserted from the lower surface side of the tray 915 into the substrate accommodation holes 919A to 919D. The substrates 902 are mounted on the substrate mounting surfaces of the substrate mounting portions 929A to 929D, which are their upper end faces. A DC voltage applying mechanism 943 applies a DC voltage to electrostatic adsorption electrodes 940. A heat-transfer gas supply mechanism 945 supplies a heat-transfer gas to between the substrates 902 and the substrate mounting surfaces.

One of the performances required for the etching apparatus is to be capable of uniformly processing an etching material. In order to improve productivity, attempts have been made to increase the areas of substrates and/or process a plurality of substrates in one process. That is, demands have arisen for an etching apparatus which can evenly perform etching on large areas.

The dry etching apparatus disclosed in Japanese Patent Laid-Open No. 10-20473 can prevent differences in etching depth between a central portion and a peripheral portion when etching one semiconductor wafer. However, Japanese Patent Laid-Open No. 10-20473 discloses nothing about prevention of differences in etching depth between a substrate accommodated in a central portion of a tray and a substrate accommodated in a peripheral portion of the tray when etching a plurality of substrates accommodated in one tray.

On the other hand, the dry etching apparatus disclosed in Japanese Patent Laid-Open No. 2007-109770 can implement a uniform plasma process throughout the entire region of a substrate surface including a portion near the outer peripheral edge by directly mounting the substrate on the substrate mounting surface by electrostatic attraction. However, Japanese Patent Laid-Open No. 2007-109770 discloses nothing about prevention of differences in etching depth between a substrate accommodated in a central portion of the tray and a substrate accommodated in a peripheral portion of the tray when etching a plurality of substrates accommodated in one tray. There is available no means for solving this problem within the range of knowledge of the present inventor.

SUMMARY OF THE INVENTION

The present invention provides a technique advantageous in reducing etching depth nonuniformity in the radial method of a tray and/or the radial direction of a substrate when etching a plurality of substrates accommodated in the tray.

An etching apparatus according to one aspect of the present invention comprises a chamber capable of being evacuated, a first electrode provided in the chamber and including a tray support portion configured to support a tray which can hold a plurality of substrates and load/unload the substrates into/from the chamber, and a voltage applying unit configured to apply a voltage to the first electrode, wherein a dielectric plate is attached to a portion, of an obverse surface of the first electrode, which faces an outer edge portion of a non-target surface of the substrate.

Further features of the present invention will become apparent from the following description of exemplary embodiments with reference to the attached drawings.

BRIEF DESCRIPTION OF THE DRAWINGS

FIGS. 22A and 22B show a plan view and sectional view of the dry etching apparatus according to the related art (Japanese Patent Laid-Open No. 10-20473).

FIG. 23 is a plan view and sectional view showing an etching rate distribution within a wafer plane in the dry etching apparatus according to the related art (Japanese Patent Laid-Open No. 10-20473) in comparison with a conventional apparatus.

DESCRIPTION OF THE EMBODIMENTS

The present inventor has made the present invention based on the following findings.

Figure 5A:
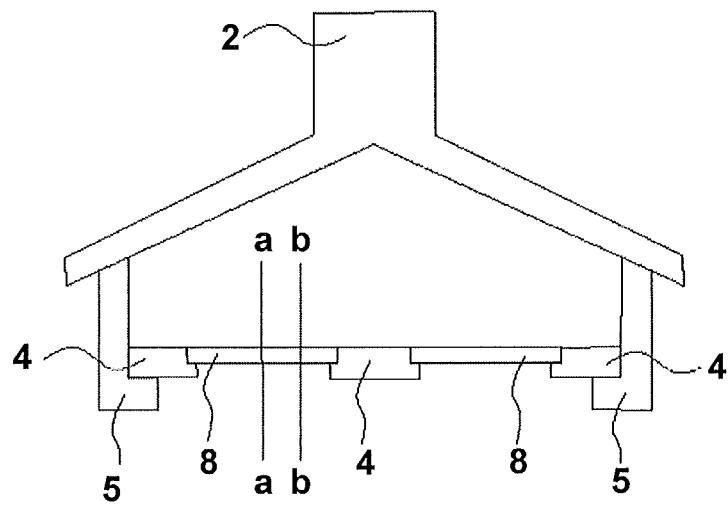
FIG. 5A is a schematic sectional view of a first electrode.

The findings by the present inventor will be described with reference to FIGS. 5A and 5B. FIG. 5A is a sectional view for explaining a first electrode 2 in detail. Substrates 8 are mounted on a tray 4 by being supported on edges of the tray 4. The electrode 2 includes clamps 5 which hold the tray 4 on which the substrates 8 are mounted. The clamps 5 hold the tray 4 transferred into a chamber by a tray transfer mechanism (not shown). The clamps 5 move to mount the tray 4 on the first electrode 2.

As shown in FIG. 5A, the obverse surface of the first electrode 2 (that is, the surface on the side on which the tray 4 is placed) is not horizontal, whereas the reverse surface of the substrate 8 is horizontal. For this reason, the distance between the lower surface of the first electrode 2 and the reverse surface (upper surface) of the substrate 8 changes in the radial direction of the first electrode 2. Differences in electric circuit between the portions indicated by a-a and b-b in FIG. 5A will be described with reference to FIG. 5B.

Figure 5B:
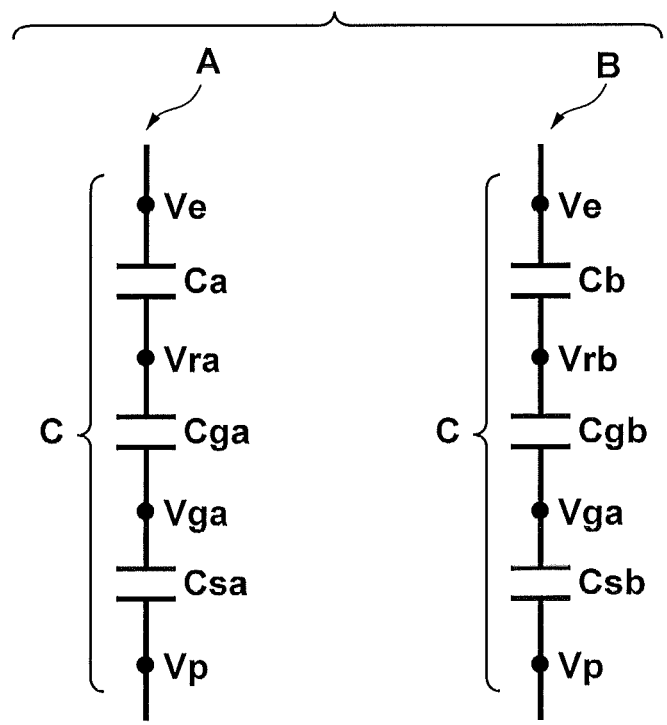
FIG. 5B shows equivalent circuits of electrostatic capacitances and potentials near the first electrode in FIG. 5A.

In FIG. 5B, "A" and "B" show equivalent circuits of the portions indicated by a-a and b-b in FIG. 5A. In the direction from the first electrode 2 to a plasma in the chamber, let Ve be the potential of the first electrode 2, Vra and Vrb be potentials on the reverse surface (upper surface) of the substrate 8, Vga and Vgb be potentials on the obverse surface (lower surface) of the substrate 8, and Vp be the potential of the plasma. Vra and Vrb respectively represent potentials on the reverse surface (upper surface) of the substrate at a-a and b-b in FIG. 5A. Vga and Vgb respectively represent potentials on the obverse surface (lower surface) of the substrate 8 at a-a and b-b in FIG. 5A.

In addition, in the direction from the first electrode 2 to the plasma in the chamber, let Ca and Cb be electrostatic capacitances between the obverse surface of the first electrode 2 and the reverse surface (upper surface) of the substrate 8, Cg be the electrostatic capacitance of the substrate 8, and Csa and Csb be the electrostatic capacitances of a plasma sheath between the obverse surface (lower surface) of the substrate 8 and the plasma. Ca and Csa represent electrostatic capacitances at a-a in FIG. 5A. Cb and Csb represent electrostatic capacitances at b-b in FIG. 5A.

The electrostatic capacitances in "A" and "B" in FIG. 5B will be described. The substrate 8 has the same dielectric constant and the same thickness in the radial direction, and hence the electrostatic capacitances Cga and Cgb of the substrate 8 are equal to each other. In contrast to this, the electrostatic capacitances between the obverse surface of the first electrode 2 and the reverse surface (upper surface) of the substrate 8 are given as Ca<Cb because the distances are different, although the dielectric constants are equal.

An electrostatic capacitance C between the plasma and the first electrode 2 through the substrate 8 is inversely proportional to Vp−Ve which is the difference between the plasma potential Vp and the potential Ve of the first electrode 2. Since the plasma potential Vp is almost constant in the radial direction of the electrode, and the first electrode 2 is a metal, the potential Ve is constant in the radial direction of the first electrode 2. That is, the electrostatic capacitance C between the plasma and the first electrode 2 through the substrate 8 remains almost the same in "A" and "B" in FIG. 5B.

The energies of ions striking the substrate 8 correspond to Vp−Vga and Vp−Vgb which are the differences between the plasma potential Vp and the potentials Vga and Vgb on the obverse surface (lower surface) of the substrate 8. Vp−Vga and Vp−Vgb are inversely proportional to the electrostatic capacitances Csa and Csb of the plasma sheath formed on the obverse surface (lower surface) of the substrate 8, respectively. Reciprocals 1/Csa and 1/Csb of the electrostatic capacitances Csa and Csb are obtained by subtracting a reciprocal 1/Ca or 1/Cb of the electrostatic capacitance between the first electrode 2 and the reverse surface (upper surface) of the substrate 8 and a reciprocal 1/Cga or 1/Cgb of the electrostatic capacitance of the substrate 8 from a reciprocal 1/C of the electrostatic capacitance C between the plasma and the first electrode 2 through the substrate 8. That is, 1/Csa=1/C−1/Ca−1/Cga, and 1/Csb=1/C−1/Cb−1/Cgb.

As described above, the electrostatic capacitance C between the plasma and the first electrode 2 through the substrate 8 remains almost the same in "A" and "B" in FIG. 5B, and the electrostatic capacitances Cga and Cgb of the substrate 8 are equal to each other. In addition, since the magnitude relationship between the electrostatic capacitances between the obverse surface of the first electrode 2 and the reverse surface of the substrate is given as Ca<Cb, the magnitude relationship between the electrostatic capacitances Csa and Csb of the plasma sheath is given as 1/Csa<1/Csb. That is, the energies Vp−Vga and Vp−Vgb of ions striking the substrate 8 in "A" and "B" in FIG. 5B are given as Vp−Vga<Vp−Vgb because the distance between the obverse surface of the first electrode 2 and the reverse surface (upper surface) of the substrate 8 at b-b in FIG. 5A is shorter than that at a-a in FIG. 5A, Vp−Vga<Vp−Vgb. That is, the present inventor has found that it was possible to improve the uniformity of the etching distribution in the radial direction of the first electrode 2 by changing ion energies in the radial direction of the first electrode 2, when etching the substrate 8 mounted on the tray 4, by changing the distance between the obverse surface of the first electrode 2 and the reverse surface (upper surface) the substrate 8 in the radial direction of the electrode.

As described above, the present inventor has found that it was possible to control energies striking the substrate 8 and improve the etching distribution in the radial direction of the first electrode 2, when etching the substrate 8 mounted on the tray 4, by changing the distance between the obverse surface of the first electrode 2, to which high-frequency power is applied, and the reverse surface (upper surface) of the substrate 8 in the radial direction of the electrode.

The present invention is based on the above findings, for example, the finding that in the etching apparatus which processes two substrates, it is possible to improve etching distributions on a substrate mounted on a tray peripheral portion and a substrate mounted on a tray central portion by setting the distance between the obverse surface of the first electrode 2 and the reverse surface (the upper surface or the surface facing the first electrode 2) of the substrate 8 so as to change the distance in the radial direction of the first electrode 2.

First Embodiment

Figure 1:
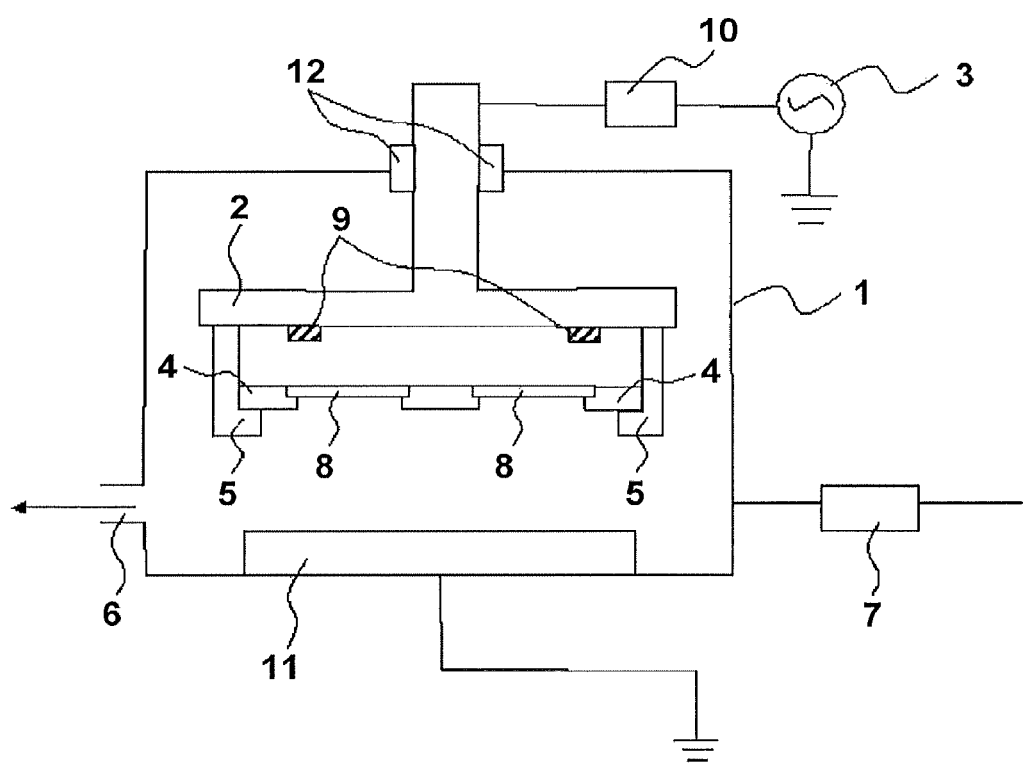
FIG. 1 is a schematic sectional view of a first etching apparatus according to the present invention.

FIG. 1 is a schematic sectional view of a first etching apparatus according to the first embodiment. As shown in FIG. 1, the first etching apparatus includes, as main constituent elements, a chamber 1 capable of evacuation and a first electrode 2 to which power is applied. In addition, the etching apparatus includes a power supply 3 for applying power required for an etching process to the first electrode 2. In the chamber 1, the first electrode 2 including clamps 5 (members made of a metal compound such as alumina) which hold a tray 4 (for example, a member made of a metal compound such as alumina) holding substrates 8 is mounted through an insulator 12 (for example, a resin such as Teflon®). The insulator 12 is a member which electrically insulates the chamber 1 and the first electrode 2. The first electrode 2 includes a tray support portion capable of supporting the outer peripheral edge portion of the tray 4.

The tray 4 can hold a plurality of substrates 8, and can be loaded and unloaded into and from the chamber 1. The chamber 1, the first electrode 2, and the insulator 12 constitute a closed space cable of evacuation. The power supply 3 (voltage applying unit) applies a voltage to the first electrode 2 in the chamber 1.

An exhaust apparatus such as a vacuum pump is connected to an exhaust port 6 of the chamber 1 through a conductance valve or the like (not shown). A gas supply mechanism 7 including a flow controller (MFC) is connected to the chamber 1 to supply a process gas. The gas supply mechanism 7 supplies a process gas into the chamber 1 at a set flow rate. It is possible to use, as process gases, various types of gases singly or in mixture in accordance with etching materials, for example, a rare gas such as argon (Ar) for sputter etching using no reactive gas and fluorocarbon gas, chlorine-based gas, and oxygen for reactive ion etching (RIE) using reactive gases. Although a second electrode (lower electrode) 11 is provided to face the first electrode 2 in FIG. 1, the second electrode 11 is not essential.

Figure 6:
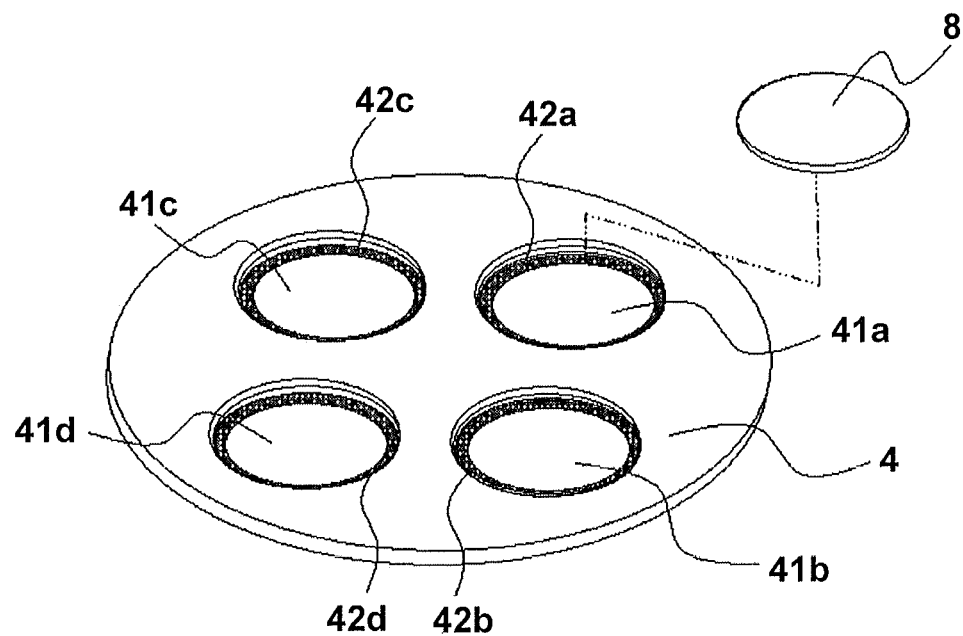
FIG. 6 is a plan view showing a state in which four substrates are held at equal angular intervals around the center of the tray.

The etching apparatus can include a matching box 10. As shown in FIG. 6, the tray 4 can hold at least two substrates with substrate holding portions circumferentially arranged at equal angular intervals around the center of the tray 4. The tray 4 in FIG. 6 is provided with a plurality of substrate accommodation holes 41a, 41b, 41c, and 41d extending through the tray 4 in the thickness direction of the substrate 8 and substrate holding portions 42a, 42b, 42c, and 42d capable of holding the entire peripheral edge portions of the substrates 8. The substrate holding portions 42a, 42b, 42c, and 42d each may be configured to be capable of holding a part of the peripheral edge portion of the substrate 8. When holding the tray 4 with the first electrode (upper electrode) 2, it is preferable to use the tray 4 shown in FIG. 6 to stably hold the substrates 8. When holding the tray 4 with the second electrode 11, it is also preferable to use the tray 4 shown in FIG. 6.

Figure 2:
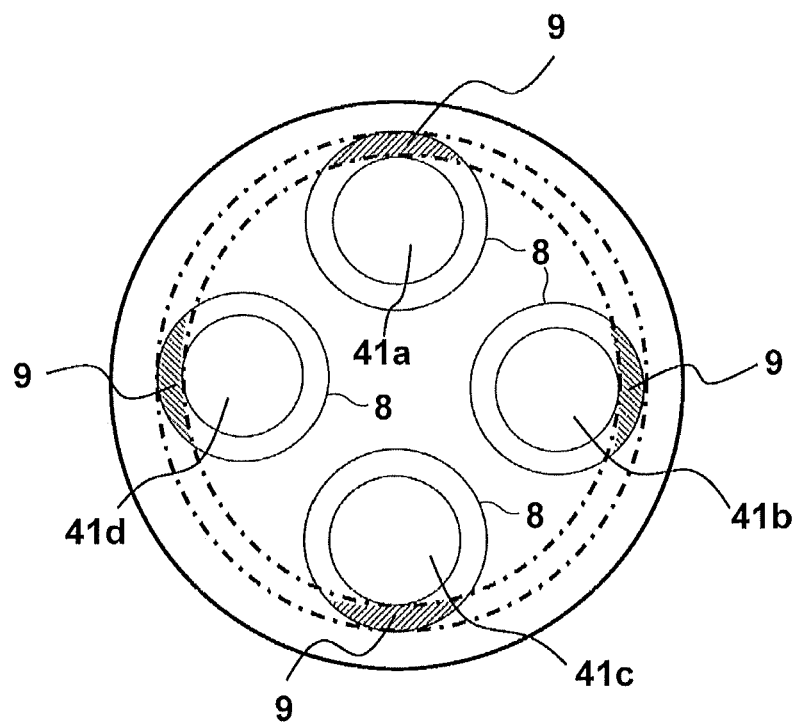
FIG. 2 is a plan view showing a state in which four substrates are held at equal angular intervals around the center of the tray of the first etching apparatus.

As shown in FIG. 2, in the first etching apparatus shown in FIG. 1, dielectric plates 9 (for example, members formed from a ceramic such as alumina) are attached to the obverse surface of the first electrode 2 so as to face portions, of the outer edge portions of the non-target surfaces (the surfaces which do not face the second electrode 11, that is, the upper surfaces) of the substrates 8, which correspond to a peripheral portion (the portion indicated by the chain line concentric circles in FIG. 2) of the tray 4. In the dry etching apparatus in FIG. 1, the substrate holding portions 42a, 42b, 42c, and 42d hold the peripheral edge portions of the substrates 8 mounted on the tray 4. In addition, the tray 4 includes the clamps 5 which hold the tray 4. It is therefore predicted that a nonuniform etching distribution will appear on a portion, of the substrate 8, which is located on the peripheral portion (the portion indicated by the chain line concentric circles in FIG. 2) of the tray 4 and the remaining portion of the substrate 8. The first etching apparatus can improve the nonuniformity of an etching distribution in the radial direction of the tray 4 by attaching the dielectric plates 9 to the obverse surface of the first electrode 2 which faces the outer edge portions (the portions indicated by the hatchings in FIG. 2) of the non-target surfaces (the surfaces which do not face the second electrode 11) of the substrates 8 at the peripheral portion (the portion indicated by the chain line concentric circles in FIG. 2) of the tray 4. In the first etching apparatus shown in FIG. 1, the first electrode 2 and the second electrode 11 respectively serve as the upper and lower electrodes. However, it is only required to make the first electrode 2 face the second electrode 11. That is, when the first electrode 2 and the second electrode 11 respectively serve as the lower and upper electrodes, this embodiment also incorporates a case in which the first electrode 2 and the second electrode 11 are provided on side walls of the chamber 1 so as to face each other.

Second Embodiment

Figure 3:
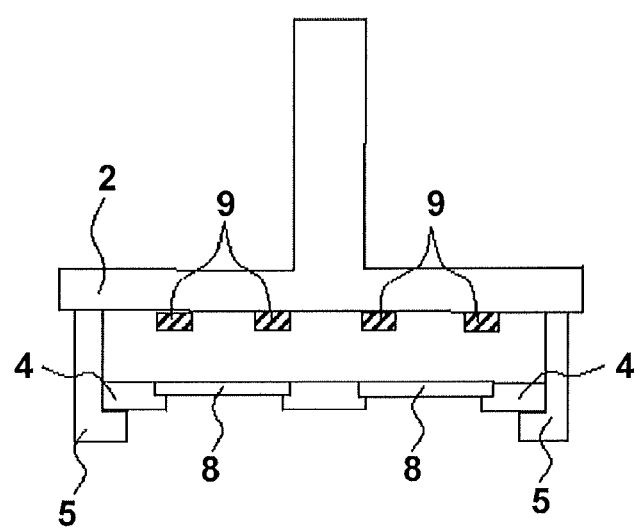
FIG. 3 is a schematic sectional view of the second embodiment of a first electrode according to the present invention.
Figure 4:
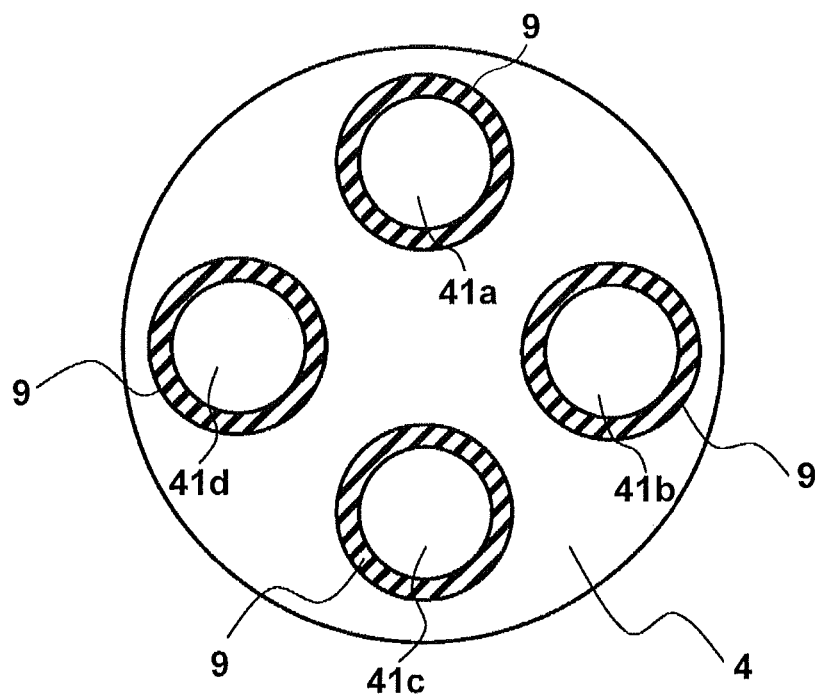
FIG. 4 is a plan view showing a state in which four substrates are held at equal angular intervals around the center of a tray in the second embodiment.

FIG. 3 is a schematic sectional view of a first electrode 2 according to the second embodiment. The basic arrangement is the same as that in the first etching apparatus. As shown in FIG. 6, a tray 4 holds four substrates at equal angular intervals around the center of the tray 4. In the second embodiment, as shown in FIG. 4, it is possible to improve the nonuniformity of an etching distribution in the radial direction of each substrate by attaching dielectric plates 9 along the peripheral edge portion of the obverse surface of a first electrode 2 so as to face the peripheral edge portions of the non-target surfaces of the four substrates provided on the peripheral portion of the tray 4. In the second embodiment, the first electrode 2 serves as the upper electrode (a second electrode 11 (not shown) serves as the lower electrode). When, however, the first electrode 2 serves as the lower electrode (the second electrode 11 (not shown) serves as the upper electrode), this embodiment also incorporates a case in which the first electrode 2 is provided on a side wall of the chamber 1 so as to face the second electrode 11.

Third Embodiment

Figure 7:
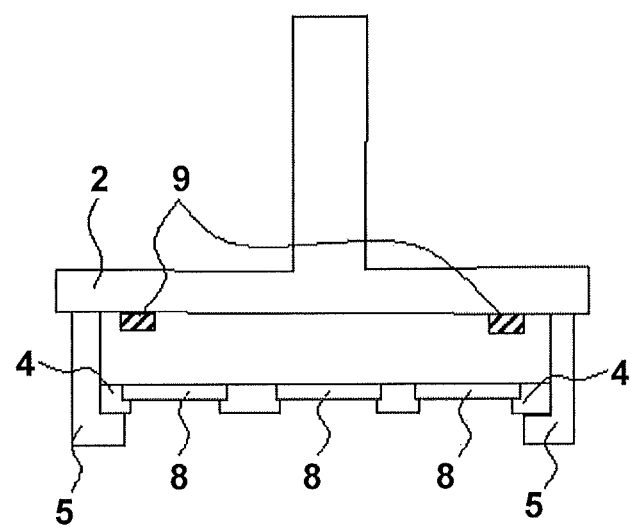
FIG. 7 is a schematic sectional view of the third embodiment of the first electrode according to the present invention.
Figure 11:
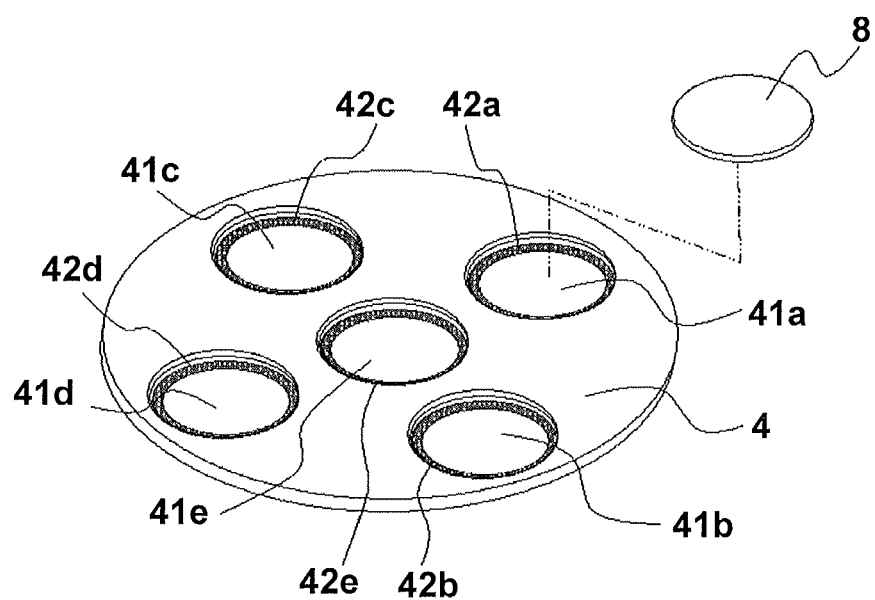
FIG. 11 is a plan view showing the first substrate held in the center of the tray, and the four second substrates held at equal angular intervals around the center of the tray.

FIG. 7 is a schematic sectional view of a first electrode according to the third embodiment. The basic arrangement of the third embodiment shown in FIG. 7 is the same as that of the etching apparatus in FIG. 1 described above. As shown in FIG. 11, a tray 4 holds a first substrate in the center of the tray 4, and at least four second substrates at equal angular intervals around the center of the tray 4. The tray 4 shown in FIG. 11 is provided with a plurality of substrate accommodation holes 41a, 41b, 41c, 41d, and 41e extending through the tray 4 in the thickness direction of substrates 8, and substrate holding portions 42a, 42b, 42c, 42d, and 42e capable of holding the entire peripheral edge portions of the substrates 8. The substrate holding portions 42a, 42b, 42c, 42d, and 42e each may be provided so as to be capable of holding a part of the peripheral edge portion of the substrate 8. When holding the tray 4 with a first electrode 2 (upper electrode), it is preferable to use the tray 4 shown in FIG. 11 to stably hold the substrates 8. When holding the tray 4 with a second electrode 11, it is also preferable to use the tray 4 shown in FIG. 11. In the third embodiment, the first electrode 2 serves as the upper electrode (a second electrode 11 (not shown) serves as the lower electrode). When, however, the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Figure 8:
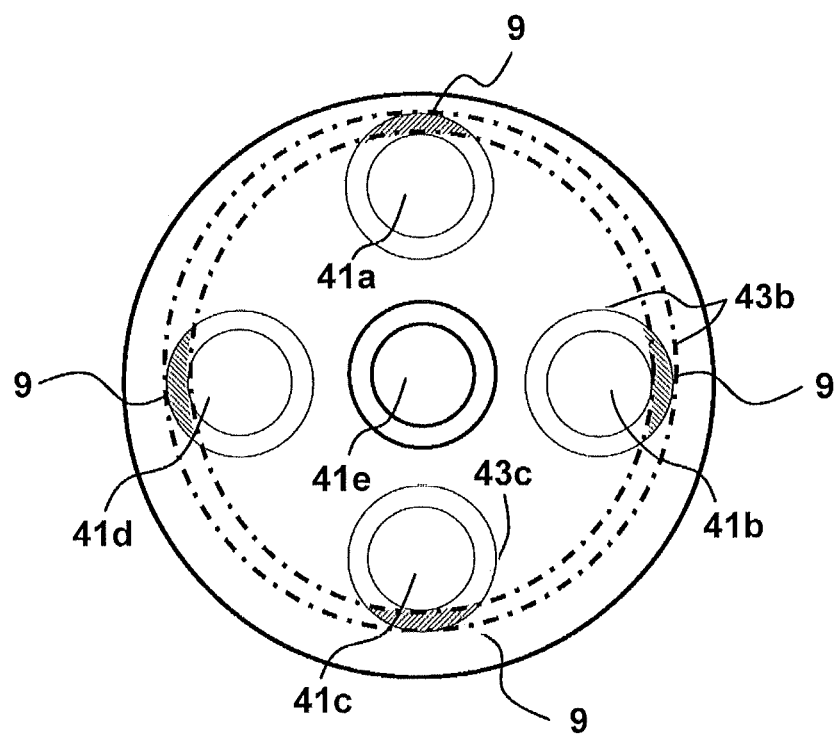
FIG. 8 is a plan view showing the first substrate held in the center of a tray in the fifth embodiment, and the four second substrates held at equal angular intervals around the center of the tray.

As shown in FIG. 8 in the third embodiment, dielectric plates 9 (for example, members formed from a ceramic such as alumina) are attached to the obverse surface of the first electrode 2 so as to face portions, of the outer edge portions of the non-target surfaces (the surfaces which do not face the second electrode 11, that is, the upper surfaces) of the substrates 8, which correspond to a peripheral portion (the portion indicated by the chain line concentric circles in FIG. 8) of the tray 4. In the third embodiment, the substrate holding portions 42a, 42b, 42c, 42d, and 42e hold the entire peripheral edge portions of the substrates 8. In addition, the tray 4 includes clamps 5 which hold the tray 4. It is therefore predicted that a nonuniform etching distribution will appear on portions, of the substrates 8, which are located on the peripheral portion (the portion indicated by the chain line concentric circles in FIG. 8) of the tray 4 and the remaining portions of the substrates 8. It is possible to improve the nonuniformity of an etching distribution in the radial direction of the tray by attaching the dielectric plates 9 to the obverse surface of the first electrode 2 so as to face portions of the outer edge portions of the non-target surfaces (the surfaces which do not face the second electrode 11, that is, the upper surface) of the substrates 8 which correspond to the peripheral portion (the portion indicated by the chain line concentric circles in FIG. 8) of the tray 4.

Fourth Embodiment

Figure 9:
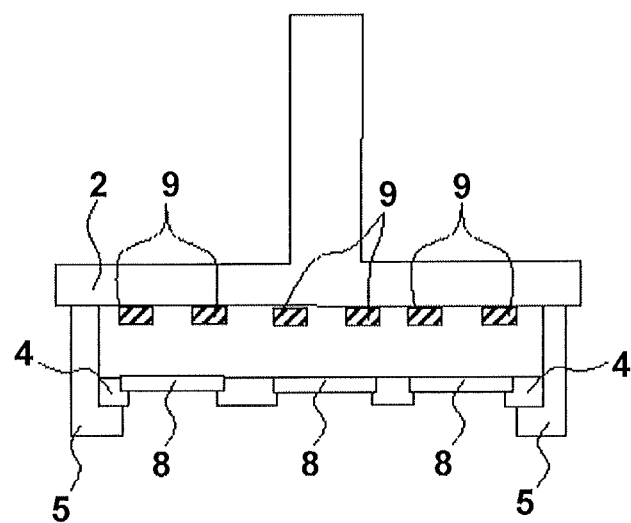
FIG. 9 is a schematic sectional view of the fourth embodiment of the first electrode according to the present invention.
Figure 10:
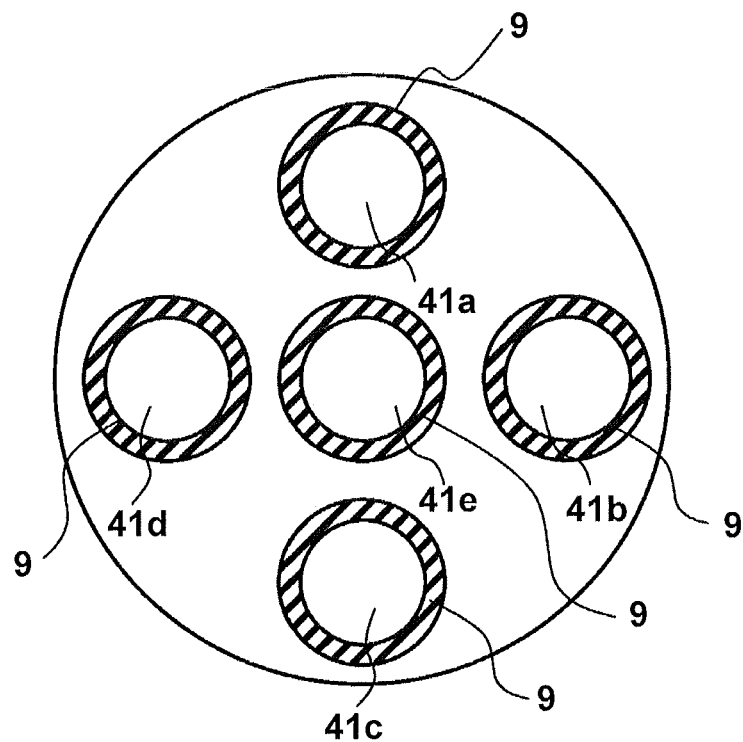
FIG. 10 is a plan view showing the first substrate held in the center of a tray in the sixth embodiment, and the three second substrates held at equal angular intervals around the center of the tray.

FIG. 9 is a schematic sectional view of a first electrode according to the fourth embodiment. The basic arrangement is the same as that in the first etching apparatus. As shown in FIG. 11, a tray 4 holds a first substrate in the center of the tray 4, and at least four second substrates at equal angular intervals around the center of the tray 4. The tray 4 shown in FIG. 11 is only required to hold a first substrate in the center of the tray 4, and at least two second substrates at equal angular intervals around the center of the tray 4. As shown in FIG. 10, in the fourth embodiment, dielectric plates 9 are attached to portions so as to face portions near the peripheral edge portions of four substrates 8 held by the tray 4. This makes it possible to improve the nonuniformity of an etching distribution in the radial direction of each substrate. In the sixth embodiment, the first electrode 2 serves as the upper electrode (a second electrode 11 (not shown) serves as the lower electrode). When, however, the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Fifth Embodiment

Figure 12:
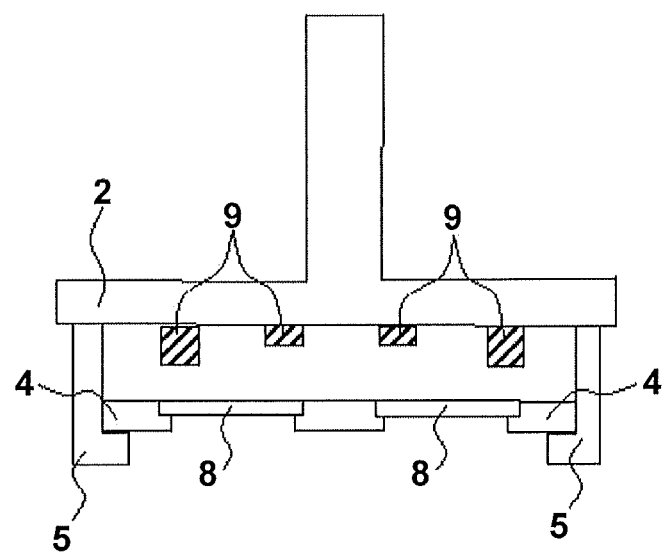
FIG. 12 is a schematic sectional view of the fifth embodiment of the first electrode according to the present invention.
Figure 13:
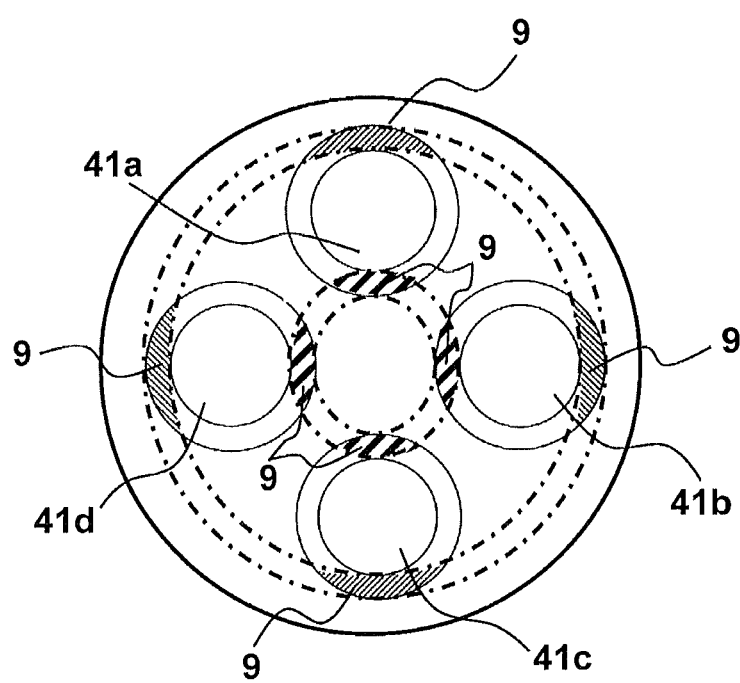
FIG. 13 is a plan view showing the four substrates held at equal angular intervals around the center of a tray in the fifth embodiment.

FIG. 12 is a schematic sectional view of a first electrode according to the fifth embodiment. The basic arrangement is the same as that in the first etching apparatus. In the fifth embodiment, dielectric plates 9 (for example, members formed from a ceramic such as alumina) are attached to the obverse surface of a first electrode 2 so as to face portions, of the non-target surfaces (the surfaces which do not face a second electrode 11, that is, the upper surfaces) of substrates 8, which correspond to a peripheral portion (the portion indicated by the two chain line concentric circles in FIG. 13) of a tray 4. In addition, second dielectric plates 9 are attached to the obverse surface of the first electrode 2 so as to face end portions (the portions, of the inner concentric circle pair of the two concentric circle pairs indicated by the chain lines in FIG. 13, which are indicated by the hatchings) of the non-target surfaces of the substrates 8 held on the center side (the portion indicated by the inner concentric circle pair of the two concentric circle pairs indicated by the chain lines in FIG. 13) of the tray 4. The second dielectric plates 9 are thinner than the dielectric plates 9. This can improve the nonuniformity of etching distributions in the radial direction of the tray 4 and the radial direction of each substrate 8. In the fifth embodiment, the first electrode 2 serves as the upper electrode (a second electrode 11 (not shown) serves as the lower electrode). When, however, the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Sixth Embodiment

Figure 14:
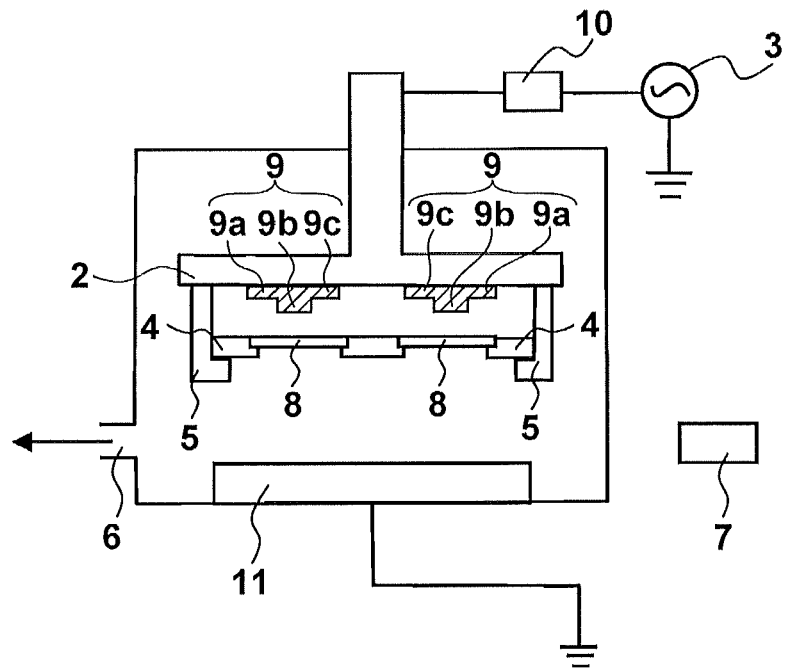
FIG. 14 is a schematic sectional view of the sixth embodiment of the first electrode according to the present invention.

FIG. 14 is a schematic sectional view of a first electrode 2 according to the sixth embodiment. The basic arrangement is the same as that in the first etching apparatus. In the sixth embodiment, dielectric plates 9 (for example, members formed from a ceramic such as alumina) are attached to the obverse surface of a first electrode 2 so as to face the non-target surfaces (the surfaces which do not face the second electrode 11) of substrates 8. In addition, dielectric plates 9b facing the central portions of the non-target surfaces of the substrates 8 are thicker than dielectric plates 9a and 9c facing the end portions of the non-target surfaces of the substrates 8. This makes it possible to improve the nonuniformity of etching distributions in the radial direction of a tray 4 and the radial direction of each substrate. In the sixth embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Seventh Embodiment

Figure 15:
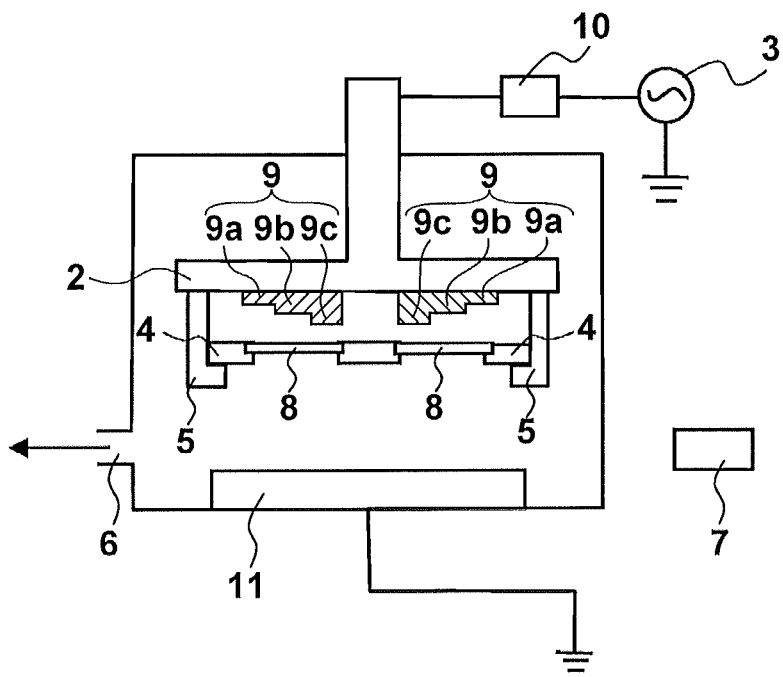
FIG. 15 is a schematic sectional view of the seventh embodiment of the first electrode according to the present invention.

FIG. 15 is a schematic sectional view of a first electrode according to the seventh embodiment. The basic arrangement is the same as that in the first etching apparatus. In the seventh embodiment, dielectric plates 9a, 9b, and 9c (for example, members formed from a ceramic such as alumina) which increase in thickness stepwise from the first end portion of the first electrode 2 to the second end portion are attached to the obverse surface of a first electrode 2 so as to face the non-target surfaces (the surfaces which do not face the second electrode 11) of substrates 8. This makes it possible to improve the nonuniformity of etching distributions in the radial direction of a tray 4 and the radial direction of each substrate. In the seventh embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Eighth Embodiment

Figure 16:
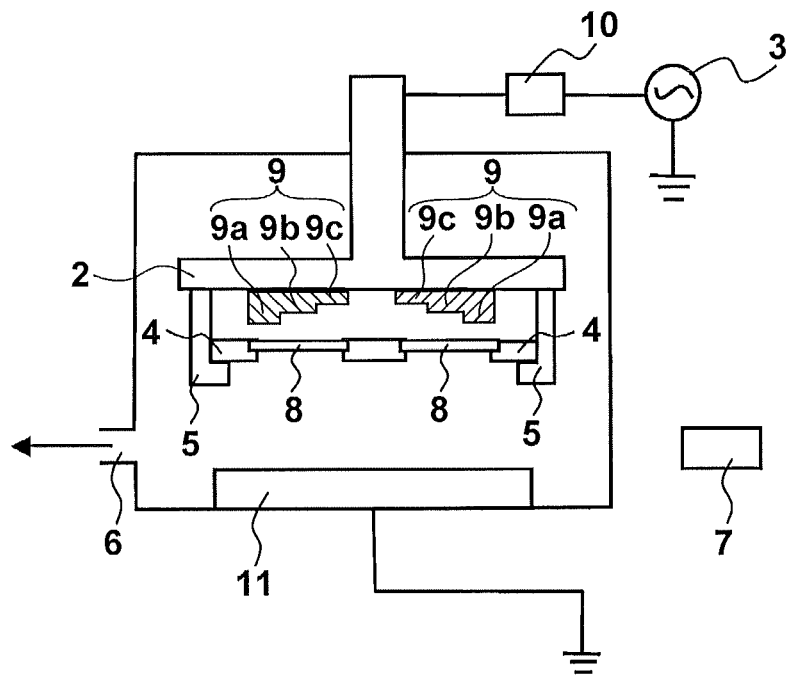
FIG. 16 is a schematic sectional view of the eighth embodiment of the first electrode according to the present invention.

FIG. 16 is a schematic sectional view of a first electrode according to the eighth embodiment. The basic arrangement is the same as that in the first etching apparatus. In the eighth embodiment, dielectric plates 9a, 9b, and 9c (for example, members formed from a ceramic such as alumina) which decrease in thickness stepwise from the first end portion of the first electrode 2 to the second end portion are attached to the obverse surface of a first electrode 2 so as to face the non-target surfaces (the surfaces which do not face the second electrode 11) of substrates 8. This makes it possible to improve the nonuniformity of etching distributions in the radial direction of a tray 4 and the radial direction of each substrate. In the eighth embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

Ninth Embodiment

Figure 17:
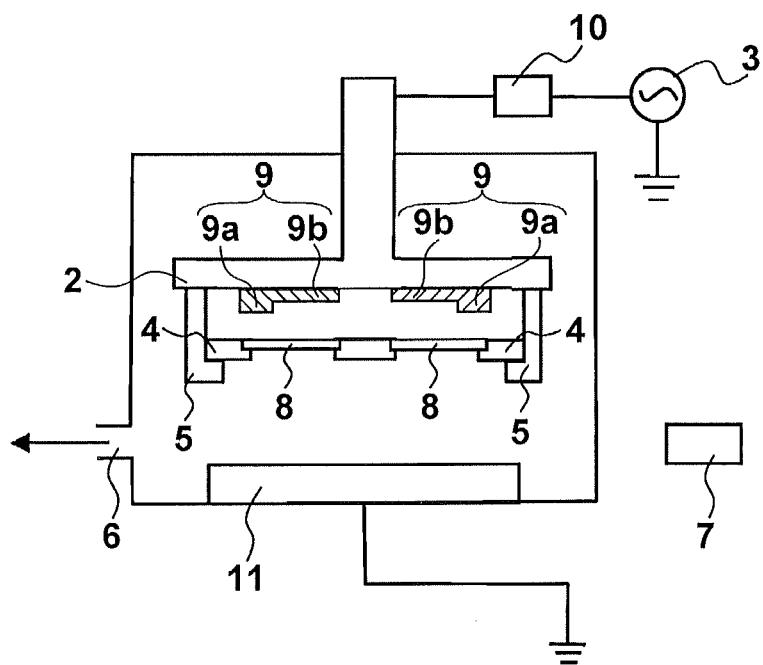
FIG. 17 is a schematic sectional view of the ninth embodiment of the first electrode according to the present invention.

FIG. 17 is a schematic sectional view of a first electrode according to the ninth embodiment. The basic arrangement is the same as that in the first etching apparatus. In the ninth embodiment, dielectric plates 9 (for example, members formed from a ceramic such as alumina) are attached to the obverse surface of a first electrode 2 so as to face the non-target surfaces (the surfaces which do not face the second electrode 11) of substrates 8. In addition, dielectric plates 9b facing a central portion of the tray 4 are thinner than dielectric plates 9a facing end portions of the tray 4. This makes it possible to improve the nonuniformity of etching distributions in the radial direction of a tray 4 and the radial direction of each substrate. In the ninth embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

10th Embodiment

Figure 18:
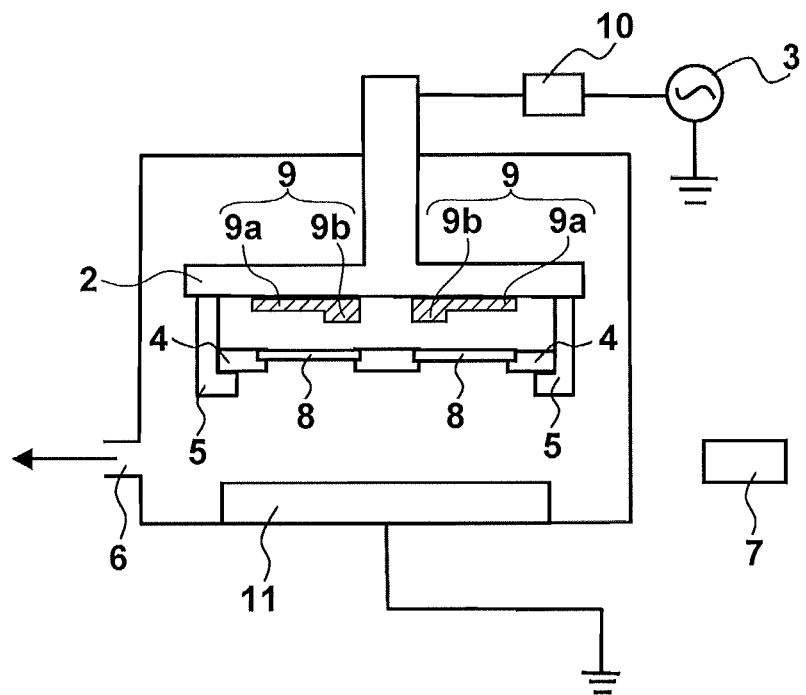
FIG. 18 is a schematic sectional view of the 10th embodiment of the first electrode according to the present invention.

FIG. 18 is a schematic sectional view of a first electrode according to the 10th embodiment. The basic arrangement is the same as that in the first etching apparatus. In the 10th embodiment, dielectric plates 9 (for example, members formed from a ceramic such as alumina) are attached to the obverse surface of a first electrode 2 so as to face the non-target surfaces (the surfaces which do not face the second electrode 11) of substrates 8. Dielectric plates 9b facing a central portion of the tray 4 are thicker than dielectric plates 9a facing end portions of the tray 4. This makes it possible to improve the nonuniformity of etching distributions in the radial direction of a tray 4 and the radial direction of each substrate. In the 10th embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

11th Embodiment

Figure 19:
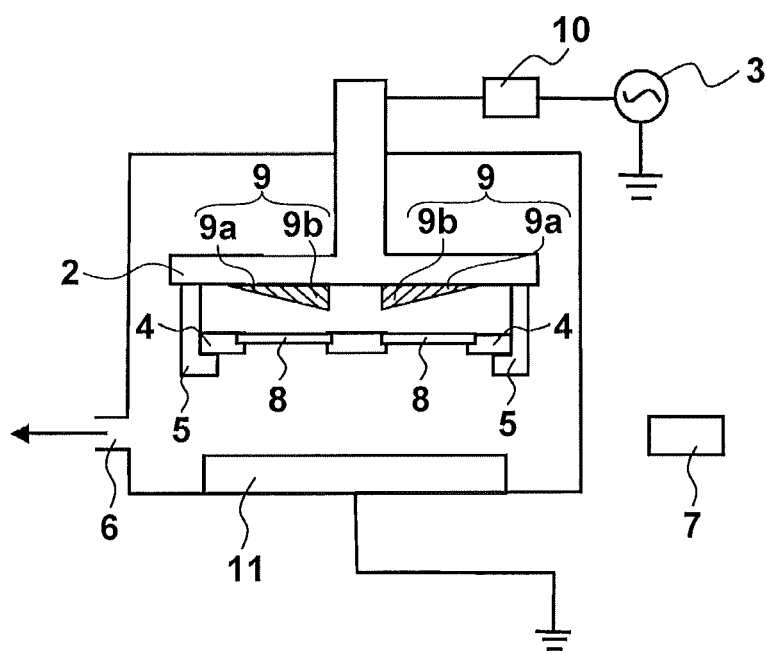
FIG. 19 is a schematic sectional view of the 11th embodiment of the first electrode according to the present invention.

FIG. 19 is a schematic sectional view of a first electrode according to the 11th embodiment. The basic arrangement is the same as that in the first etching apparatus. In the 11th embodiment, dielectric plates 9 (for example, members formed from a ceramic such as alumina) are attached to the obverse surface of a first electrode 2 so as to face the non-target surfaces (the surfaces which do not face the second electrode 11) of substrates 8. In addition, each dielectric plate 9 continuously increases in thickness from a portion 9a facing the first end portion of the non-target surface of the substrate 8 to a portion 9b facing the second end portion of the non-target surface of the substrate 8. This makes it possible to improve the nonuniformity of etching distributions in the radial direction of a tray 4 and the radial direction of each substrate. In the 11th embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

12th Embodiment

Figure 20:
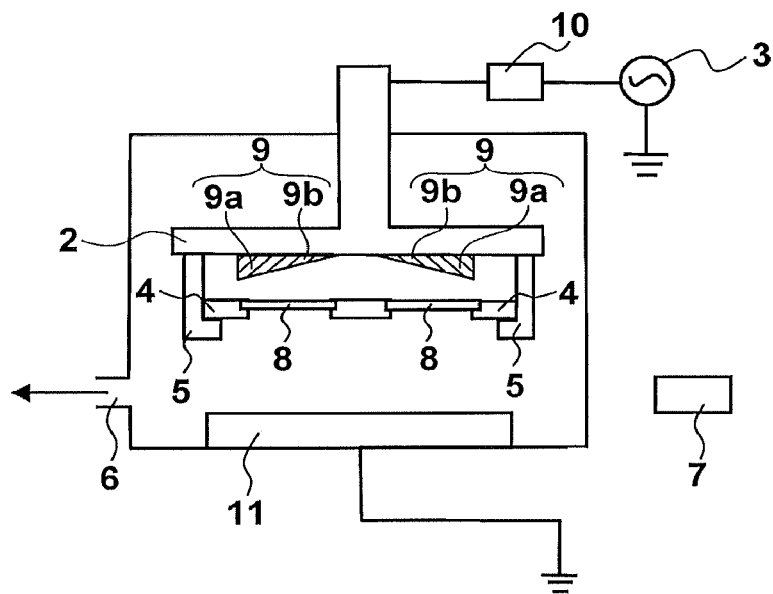
FIG. 20 is a schematic sectional view of the 12th embodiment of the first electrode according to the present invention.
Figure 21:
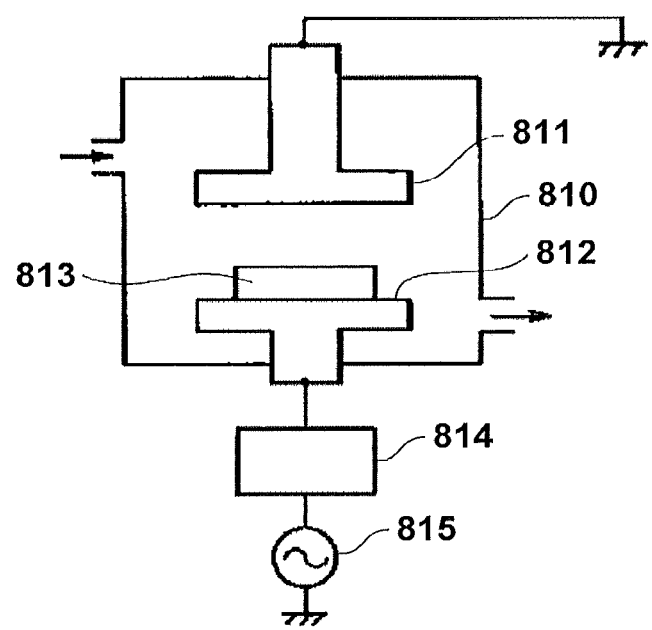
FIG. 21 is a view showing the schematic arrangement of a dry etching apparatus according to a related art (Japanese Patent Laid-Open No. 10-20473).
Figure 24:
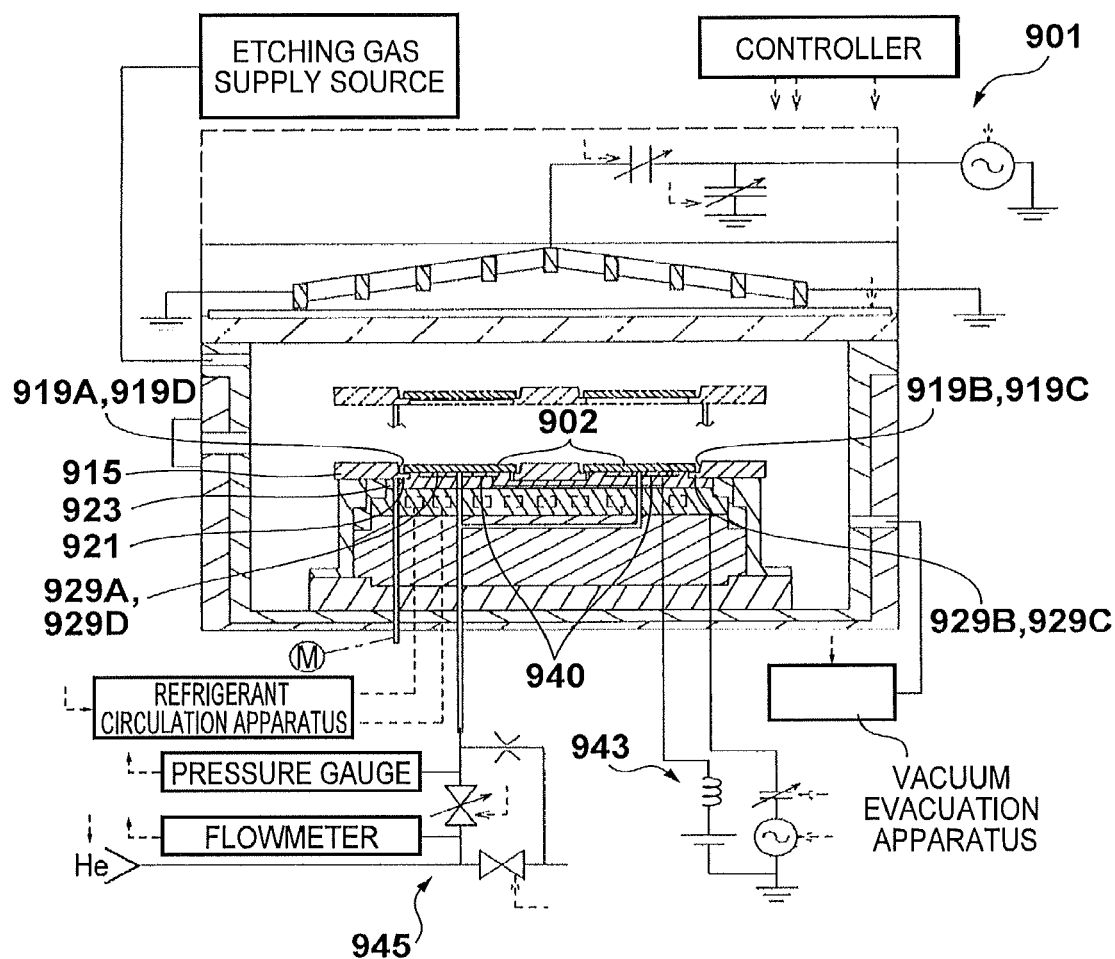
FIG. 24 is a schematic sectional view of a dry etching apparatus according to the related art (Japanese Patent Laid-Open No. 2007-109770).

FIG. 20 is a schematic sectional view of a first electrode according to the 12th embodiment. The basic arrangement is the same as that in the first etching apparatus. In the 12th embodiment, dielectric plates 9 (for example, members formed from a ceramic such as alumina) are attached to the obverse surface of a first electrode 2 so as to face the non-target surfaces (the surfaces which do not face the second electrode 11) of substrates 8. In addition, each dielectric plate 9 continuously decreases in thickness from a portion a facing the first end portion of the non-Larger surface of the substrate 8 to a portion 9b facing the second end portion of the non-target surface of the substrate 8. This makes it possible to improve the nonuniformity of etching distributions in the radial direction of a tray 4 and the radial direction of each substrate. In the seventh embodiment, the first electrode 2 serves as the upper electrode (the second electrode 11 (not shown) serves as the lower electrode). However, when the first electrode 2 serves as the lower electrode (the second electrode 11 (not shown) serves as the upper electrode), this embodiment also incorporates a case in which the first electrode 2 is provided on a side wall of a chamber 1 so as to face the second electrode 11.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-104983 filed May 17, 2013 and 2014-080474 filed Apr. 9, 2014, which are hereby incorporated by reference herein in their entirety.

REFERENCE SIGNS LIST 1 chamber
2 first electrode
3 power supply
4 tray
5 clamp
6 exhaust port
7 gas supply mechanism
8 substrate
9 dielectric plate
10 matching box
11 second electrode
12 insulator

What is claimed is:

1. An etching apparatus for etching a first surface of each of a plurality of substrates by plasma, the apparatus comprising:
   a chamber having an evacuated internal space capable of being evacuated;
   a first electrode having a plate portion arranged in the evacuated internal space and a columnar portion extending upwardly from a central portion of the plate portion, the columnar portion being supported by a ceiling of the chamber via an insulator;
   a second electrode arranged in the evacuated internal space so as to face a lower surface of the first electrode;
   a tray support portion arranged in the evacuated internal space and supported by the first electrode and configured to support a tray having a plurality of substrate accommodation holes which respectively support outer edge portions of the first surfaces of the plurality of substrates such that the plurality of substrates are located between the first electrode and the second electrode in the evacuated internal space;
   when the first surfaces of the plurality of substrates are arranged to face an upper surface of the second electrode, second surfaces of the plurality of substrates, which are opposite to the first surfaces, face the lower surface of the first electrode; and
   a voltage applying unit configured to apply a voltage to the first electrode to generate a plasma for etching the first surfaces of the substrates,
   wherein at least one dielectric plate is arranged between the first electrode and the second surfaces of the plurality of substrates such that the at least one dielectric plate is attached to a portion of the lower surface of the first electrode so that the at least one dielectric plate is vertically above at least a first portion of at least one of the substrate accommodation holes, and
   wherein the evacuated internal space, the first electrode, and the tray support portion are configured such that there is no structure vertically arranged between second portions of each of the substrate accommodation holes and the lower surface of the first electrode.

2. The etching apparatus according to claim 1, wherein the plurality of substrates are mounted at equal angular intervals around the center of the tray.

3. The etching apparatus according to claim 1, further comprising a substrate accommodation hole in the center of the tray.

4. The etching apparatus according to claim 1, wherein the dielectric plates have a shape in which a portion of the dielectric plates, facing a central portion of the second surface of each of the plurality of substrates is thicker than a portion of the dielectric plates facing the outer edge portion of the second surface of each of the plurality of substrates.

5. The etching apparatus according to claim 1, wherein the first portion is in more of a peripheral portion of the tray than the second portion.

6. The etching apparatus according to claim 1, wherein the tray includes a center, and the plurality of substrates are mounted at equal angular intervals around the center of the tray, the dielectric plates form a profile that has an N-fold rotation symmetry with respect to the center of the tray, and N is defined by the number of the plurality of substrates.

7. The etching apparatus according to claim 1, wherein the tray support portion is configured to support the tray of substrates at an outer peripheral portion of the tray.

8. The etching apparatus according to claim 1, wherein the second electrode is grounded.

9. The etching apparatus according to claim 1, wherein the second portions of at least one of the substrate accommodation holes are not vertically juxtaposed with any of the at least one dielectric plate.

10. The etching apparatus according to claim 1, wherein the first electrode is larger than the tray, and the first electrode is larger than the second electrode.

11. An etching apparatus for etching a first surface of each of a plurality of substrates by plasma, the apparatus comprising:
- a chamber having an evacuated internal space capable of being evacuated;
- a first electrode having a plate portion arranged in the evacuated internal space and a columnar portion extending upwardly from a central portion of the plate portion, the columnar portion being supported by a ceiling of the chamber via an insulator;
- a second electrode arranged in the evacuated internal space so as to face a lower surface of the first electrode;
- a tray support portion arranged in the evacuated internal space and supported by the first electrode and configured to support a tray having a plurality of substrate accommodation holes which respectively support outer edge portions of the first surfaces of the plurality of substrates such that the plurality of substrates are located between the first electrode and the second electrode in the evacuated internal space,
- when the first surfaces of the plurality of substrates are arranged to face an upper surface of the second electrode, second surfaces of the plurality of substrates, which are opposite to the first surfaces, face the lower surface of the first electrode; and
- a voltage applying unit configured to apply a voltage to the first electrode to generate a plasma for etching the first surfaces of the substrates,
- wherein at least one dielectric plate is arranged between the first electrode and the second surfaces of the plurality of substrates such that the at least one dielectric plate is placed along a peripheral edge portion of the lower surface of the first electrode so that each of the at least one dielectric plate is vertically above a first portion of at least one of the substrate accommodation holes, and
- wherein the evacuated internal space, the first electrode, and the tray support portion are configured such that there is no structure vertically arranged between second portions of each of the substrate accommodation holes and the lower surface of the first electrode.

12. The etching apparatus according to claim 11, further comprising a substrate accommodation hole in the center of the tray.

13. The etching apparatus according to claim 11, wherein the plurality of substrates are mounted at equal angular intervals around the center of the tray, and
- wherein the tray includes a center, and the dielectric plates form a profile that has an N-fold rotation symmetry with respect to the center of the tray, and N is defined by the number of the plurality of substrates.

14. The etching apparatus according to claim 11, wherein the first portion is in more of a peripheral portion of the tray than the second portion.

15. The etching apparatus according to claim 11, wherein the tray support portion is configured to support the tray of substrates at an outer peripheral portion of the tray.

16. The etching apparatus according to claim 11, wherein the second electrode is grounded.

17. The etching apparatus according to claim 11, wherein the second portions of at least one of the substrate accommodation holes are not vertically juxtaposed with any of the at least one dielectric plate.

18. The etching apparatus according to claim 11, wherein the first electrode is larger than the tray, and the first electrode is larger than the second electrode.

19. An etching apparatus for etching a first surface of each of a plurality of substrates by plasma, the apparatus comprising:
- a chamber having an evacuated internal space capable of being evacuated;
- a first electrode having a plate portion arranged in the evacuated internal space and a columnar portion extending upwardly from a central portion of the plate portion, the columnar portion being supported by a ceiling of the chamber via an insulator;
- a second electrode arranged in the evacuated internal space so as to face a lower surface of the first electrode;
- a tray support portion arranged in the evacuated internal space and supported by the first electrode and configured to support a tray having a plurality of substrate accommodation holes which respectively support outer edge portions of the first surfaces of the plurality of substrates at equal angular intervals around the center of the tray such that the plurality of substrates are located between the first electrode and the second electrode in the evacuated internal space,
- when the first surfaces of the plurality of substrates are arranged to face an upper surface of the second electrode for etching, second surfaces of the plurality of the substrates, which are opposite to the first surfaces, face the lower surface of the first electrode; and
- a voltage applying unit configured to apply a voltage to the first electrode to generate a plasma for etching the first surfaces of the substrates,
- wherein at least one dielectric plate is attached to the lower surface of the first electrode such that the at least one dielectric plate is vertically above a first portion of at least one of the substrate accommodation holes,
- wherein the evacuated internal space, the first electrode, and the tray support portion are configured such that there is no structure vertically arranged between second portions of each of the substrate accommodation holes and the lower surface of the first electrode, and
- wherein the number of the plurality of substrates is N, and the dielectric plates form a profile that is N-fold rotation symmetry with respect to a center of the tray.

20. The etching apparatus according to claim 19, wherein the dielectric plates include a plurality of dielectric portions whose number is N, and each of the plurality of dielectric portions is arranged to face a corresponding substrate of the plurality of substrates.

21. The etching apparatus according to claim 19, wherein the second electrode is grounded.

22. The etching apparatus according to claim 19, wherein the second portions of at least one of the substrate accommodation holes are not vertically juxtaposed with any of the at least one dielectric plate.

23. The etching apparatus according to claim 19, wherein the first electrode is larger than the tray, and the first electrode is larger than the second electrode.

* * * * *